(12) United States Patent
Jackson

(10) Patent No.: US 7,317,318 B2
(45) Date of Patent: Jan. 8, 2008

(54) FEXT CANCELLATION OF MATED RJ45 INTERCONNECT

(75) Inventor: Robert J Jackson, Monroe, WA (US)

(73) Assignee: Fluke Corporation, Everett, WA (US)

( * ) Notice: Subject to any disclaimer, the term of this patent is extended or adjusted under 35 U.S.C. 154(b) by 338 days.

(21) Appl. No.: 10/833,639

(22) Filed: Apr. 27, 2004

(65) Prior Publication Data

US 2005/0239340 A1    Oct. 27, 2005

(51) Int. Cl.
*G01R 27/28* (2006.01)
*G01R 31/04* (2006.01)
*H01R 24/00* (2006.01)

(52) U.S. Cl. ............... 324/628; 324/538; 439/676
(58) Field of Classification Search ............. 324/628, 324/538, 684; 439/676
See application file for complete search history.

(56) References Cited

U.S. PATENT DOCUMENTS

| | | | | |
|---|---|---|---|---|
| 5,532,603 A * | 7/1996 | Bottman | ............. | 324/628 |
| 5,997,358 A * | 12/1999 | Adriaenssens et al. | ...... | 439/676 |
| 6,259,258 B1 * | 7/2001 | Cook et al. | ............. | 324/628 |
| 6,377,640 B2 * | 4/2002 | Trans | ............. | 375/354 |
| 6,866,548 B2 * | 3/2005 | Hashim | ............. | 439/676 |
| 6,912,208 B2 * | 6/2005 | Zimmerman et al. | ....... | 370/282 |
| 6,965,657 B1 * | 11/2005 | Rezvani et al. | ............. | 375/346 |
| 2001/0000424 A1 * | 4/2001 | Kirk et al. | ............. | 324/674 |
| 2004/0033728 A1 * | 2/2004 | Weatherley | ............. | 439/676 |

* cited by examiner

*Primary Examiner*—Andrew H. Hirshfeld
*Assistant Examiner*—Jeff Natalini
(74) *Attorney, Agent, or Firm*—Richard A. Koske; James H. Walters

(57) ABSTRACT

A network test instrument provides maximum compensation of FEXT by use of mutual inductance between one or more signals. The inductance is suitably formed as a PCB trace component, or as discrete components.

5 Claims, 5 Drawing Sheets

FEXT compensation circuit

RJ45 PLUG Electrical Model

RJ45 Jack Electrical Model

FEXT CANCELLATION OF MATED RJ45 INTERCONNECT

BACKGROUND OF THE INVENTION

This invention relates to network testing, and more particularly to a method and apparatus for canceling Far End Cross Talk (FEXT) in an interconnection.

Referring to FIG. 1, a representation of a typical plug/jack combination illustrating a NEXT and FEXT component, a plug 12 interfaces signal ports A' and B' to signal ports A and B via jack 14. Referring to a single signal source, Near End Cross Talk (NEXT) is energy from a signal source at port A that is coupled to port B, while Far End Cross Talk (FEXT) is energy from the signal source on port A that is coupled to port B'.

In design of connector jacks, such as an RJ45 jack, for example, the typical goal of a jack designer is to optimize the properties of the jack to minimize return loss, Near End Cross Talk (NEXT) loss and Far End Cross Talk (FEXT) loss. However, because of the interrelated nature of these properties, maximum cancellation of any given parameter is not achieved.

An electrical model of a typical RJ45 plug and of a typical RJ45 jack are show in FIG. 2 and FIG. 3, respectively. The plug consists of 8 connectors, receiving an input cable and providing plug contacts, while the jack has corresponding inputs that connect with the plug contacts and solder leads for soldering to a printed circuit board. The various adjacent lines are mutually inductive and mutually capacitive with their adjacent lines.

SUMMARY OF THE INVENTION

In accordance with the invention, FEXT signal components are canceled at a connector plug/jack combination in order to achieve minimum FEXT.

Accordingly, it is an object of the present invention to provide an improved test instrument that effectively cancels FEXT signal components at the instrument connector.

It is a further object of the present invention to provide an improved method to perform NEXT measurements by eliminating reflected FEXT signals from the measurements.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

The system according to a preferred embodiment of the present invention comprises an implementation of a test instrument for performing test and measurement operations.

The invention provides an improved test instrument that effectively cancels FEXT signal components at the instrument connector. Reflected energy from the link-under-test is coupled into the receiving signal path by FEXT occurring in the instrument connector. The "reflected FEXT" energy component is an error component in the NEXT measurement of the link.

Figure 1:
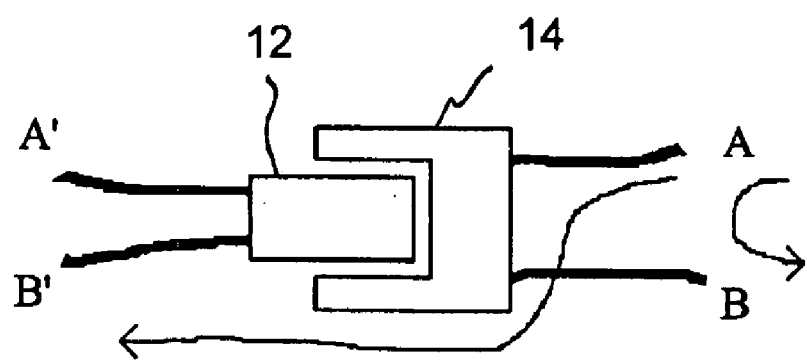
FIG. 1 is a representation of a typical plug/jack combination illustrating a NEXT and FEXT component.
Figure 2:
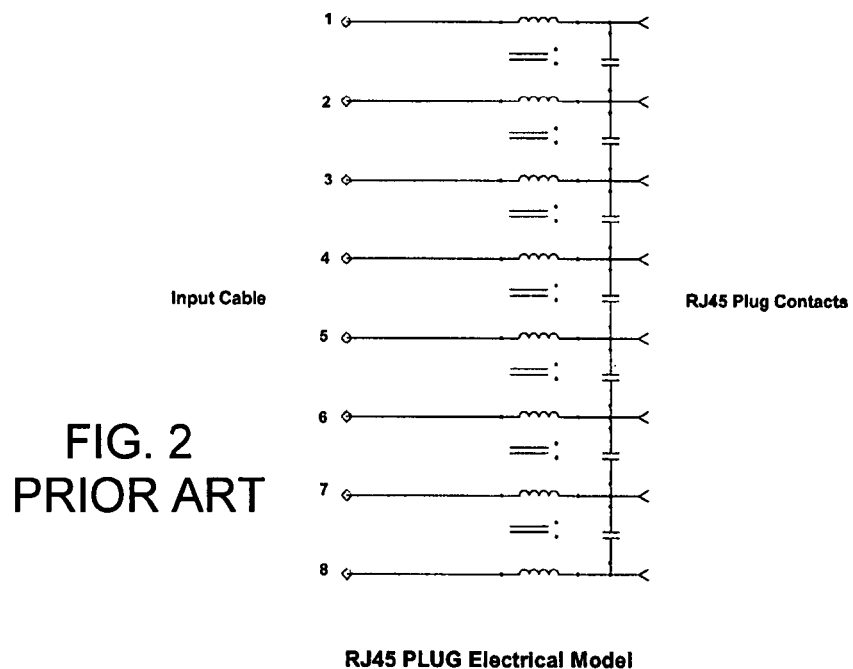
FIG. 2 is a circuit diagram illustrating the electrical model of an RJ45 plug.
Figure 3:
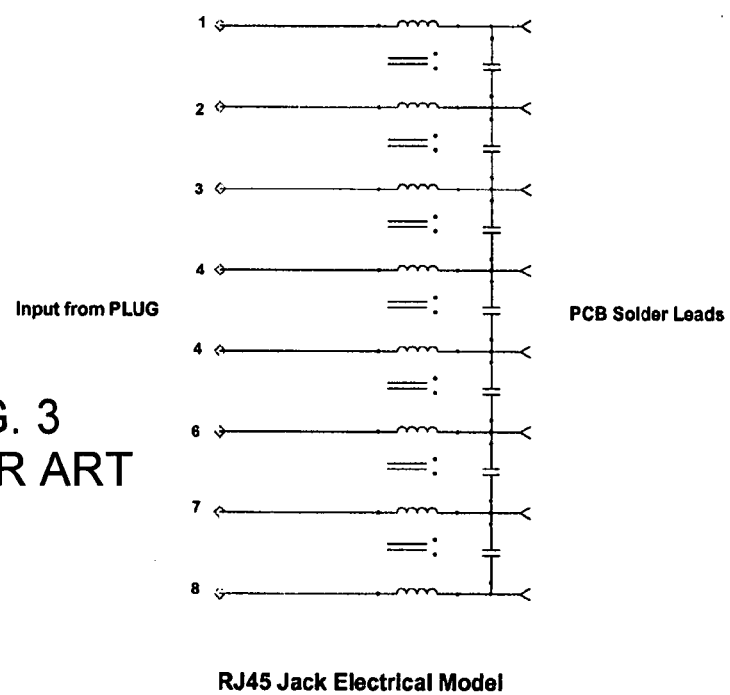
FIG. 3 is a circuit diagram illustrating the electrical model of an RJ45 jack.
Figure 4:
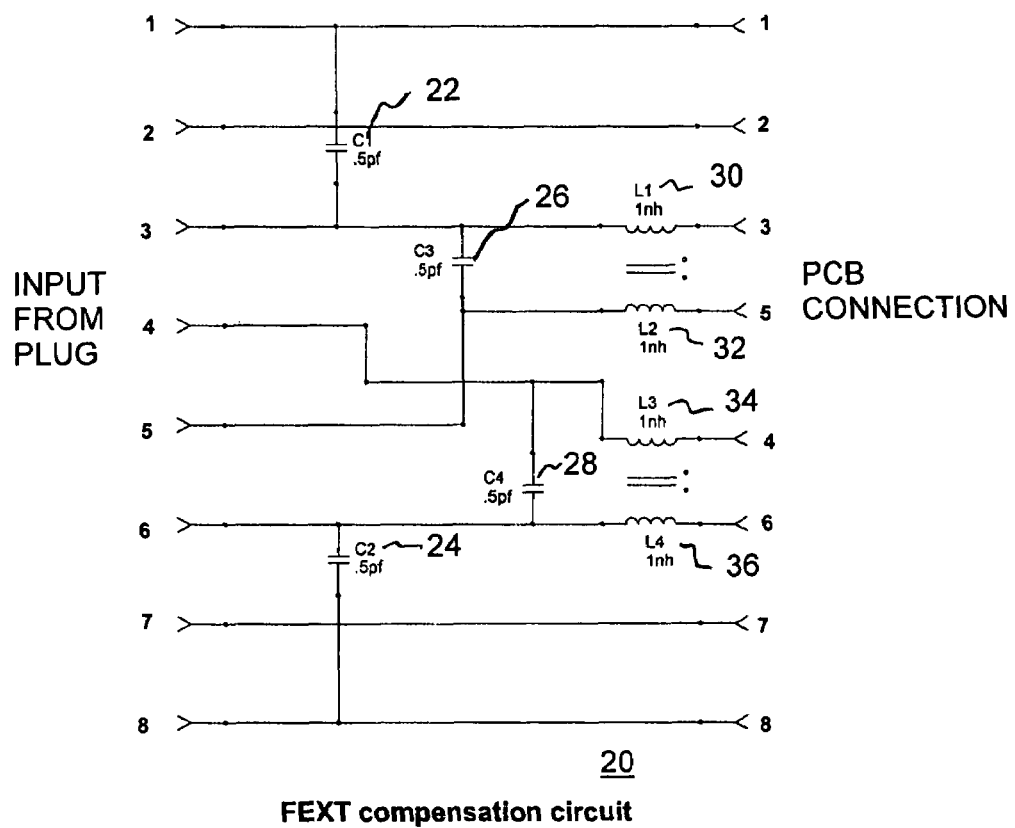
FIG. 4 is a circuit diagram of an FEXT compensation circuit in accordance with the invention.

Referring to FIG. 4, a circuit diagram of an FEXT compensation circuit in accordance with the invention, the preferred embodiment of the invention is implemented in a test and measurement instrument for use with networking. The instrument has an RJ45 jack therein to receive a corresponding RJ45 plug, to connect to a network cable. In order to minimize FEXT, a compensation circuit 20 is provided. In FIG. 4, the compensation circuit is described with respect to the 36-45 pair combination, but corresponding techniques are employed with respect to other signal pairs.

In the view of FIG. 4, the input from the jack is on the left side, while the right side is the continuation of the printed circuit board connection. Shown are connector lines 1-8, wherein capacitors 22 (C1), 24 (C2), 26 (C3) and 28 (C4) couple lines 1-3, 6-8, 3-5 and 4-6, respectively. An inductor 30 (L1) is serially interposed between the input from plug and PCB side of conductor 3, capacitor 26 being connected at the plug input side of inductor 30. A second mutual (relative to inductor 30) inductor 32 (L2) connects to capacitor 26 at the line 5 plug input end thereof, while the opposite end of inductor 32 connects to the PCB side of the instrument. A corresponding mutual inductor pair 34 (L3) and 36 (L4) are supplied serially between the conductor 4 plug input/conductor 4 PCB connection (inductor 34) and between the conductor 6 plug input/conductor 6 PCB connection (inductor 36). The jack input side of inductor 34 connects to the conductor 4 end of capacitor 28, while the jack input side of inductor 36 connects to the opposite, line 6 end of capacitor 28. Capacitor 24 is also suitably connected at the jack input side of inductor 36.

In operation of a typical RJ45 jack/plug combination, signal pairs are configured as follows, pair 1 comprises lines 1 and 2, pair 2 comprises lines 3 and 6, pair 3 comprises lines 4 and 5 and pair 4 comprises lines 7 and 8. Energy is coupled from signal lines 3 to 4 and signal lines 5 to 6 through the adjacent mutual inductances and adjacent capacitances that are inherent to the physical construction of RJ45 plugs and jacks. In accordance with the invention, the compensation circuit of FIG. 4 operates to reverse the phase of the coupling by placing mutual inductance of inductors 30, 32 and capacitance of capacitor 26 between signal lines 3 to 5 and by placing mutual inductance of inductors 30, 32 and capacitance of capacitor 26 between signal lines 3 to 5, an by placing mutual inductance of inductors 34, 36 and capacitance of capacitor 28 between signal lines 4 and 6. FEXT cancellation is achieved by the inclusion of anti-phase inductive coupling of c inductors 30 to 30 and inductors 34 to 36, while the capacitors 22, 24, 26 and 28 help to mitigate overall NEXT response.

While the implementation of the invention is described hereinabove with respect to signal pair combination 3-6 and 4-5, corresponding compensation strategies are employable with respect to any pair combination. In a typical RJ45 interconnection, the most important signals are 1-2 to 3-6, 3-6 to 4-5 and 3-6 to 7-8.

The preferred embodiment of the invention implements the mutual inductances 30/32 and 34/36 by providing the inductances formed as layers/traces of a printed circuit board. However, this is not a requirement, and an alternative embodiment can employ discrete transformers or other components for some or all of the mutual inductances.

Figure 6:
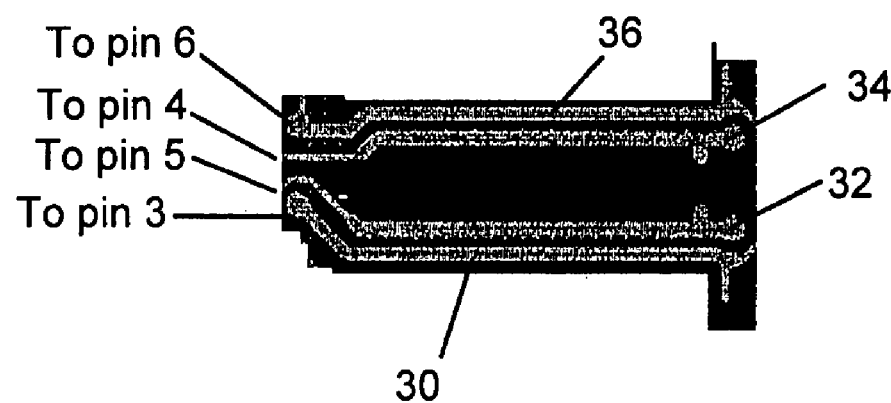
FIG. 6 illustrates a particular PCB trace configuration that is employed in connection with a PCB implementation of the mutual inductances.

FIG. 6 is an exemplary PCB trace configuration for implementing the inductances 30/32 and 34/36 on a printed circuit board rather than as discrete components.

In a particular embodiment, capacitors 22, 24, 26 and 28 have a value of 0.5 pf, while inductors 30, 32, 34 and 36 are 1.0 nh. A preferred jack in a particular embodiment comprises a Molex Inverted Modular RJ45 PCB mount jack, while preferred plugs are AVAYA CAT6 RJ45 plugs, or Fluke Networks PM06 test plugs. Other jack/plug combinations may be employed, and specific values for inductors 30-36 and capacitors 22-28 may be varied to further optimize performance for a specific other jack/plug combination. Category 6 (CAT6) plugs have precisely defined properties as established by the Telecommunications Industry Association, which enables interoperability between different manufacturers of CAT6 RJ45 plugs.

Figure 5:
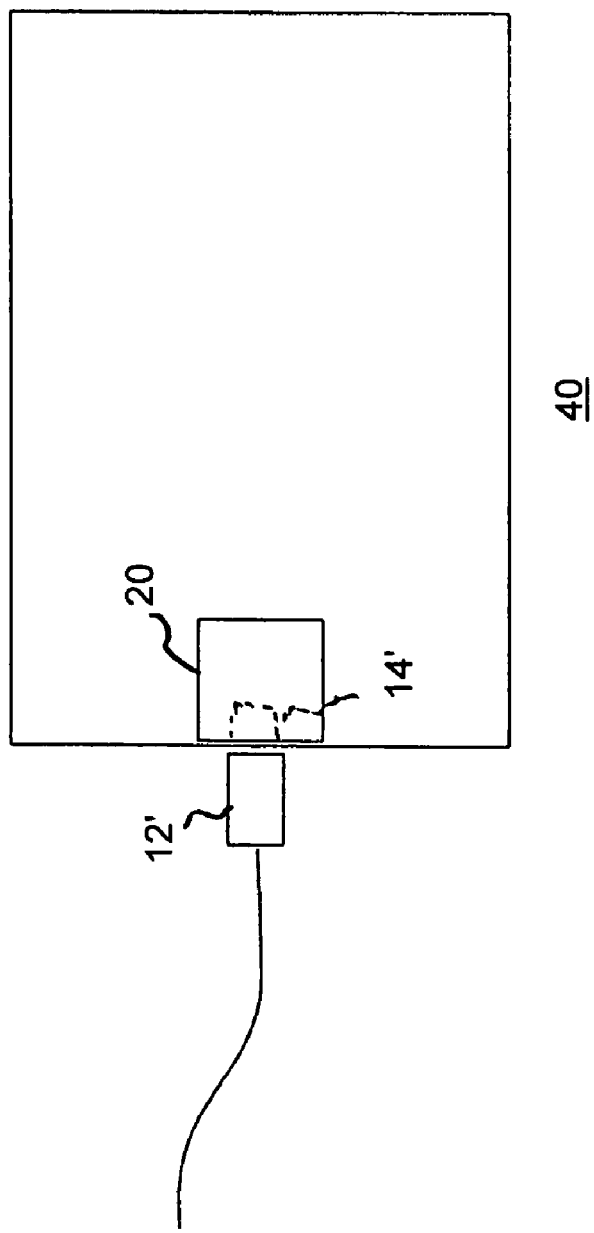
FIG. 5 is a diagram of a test instrument implementing the invention.

The invention is suitably implemented as a component of a test instrument for network testing. FIG. 5 illustrates a block diagram of the instrument 40, wherein the plug 12' is received by the instrument via jack 14' (not shown) which is designed into the measurement instrument, where the plug/jack are CAT6 RJ45 plug/jack components, to the compensation circuit 20. The instrument is a hand held device in the preferred embodiment.

The invention thus achieves extreme FEXT cancellation in accordance with the illustrated embodiment in a RJ45 plug/jack interconnect. The particular configuration can result, however, in a tradeoff of increased plug/jack NEXT. However, NEXT can be readily factored out by a test instrument employing software techniques. Therefore, by compensating for FEXT with a hardware technique as discussed herein, measurement of network parameters may be more accurately accomplished.

The use of the FEXT cancellation in conjunction with the techniques to remove NEXT, such as those described in U.S. Pat. No. 5,532,603, CROSS-TALK MEASUREMENT APPARATUS WITH NEAR-END COMPENSATION, the disclosure of which is incorporated herein by reference, allows achievement of a high quality measurement port for a certification instrument. The FEXT cancellation method and apparatus is beneficial because it corrects reflected energy from coupling back into a NEXT measurement of the link-under-test.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A method of operating a test instrument to compensate for near end cross talk (NEXT) and far end cross talk (FEXT) in measurement signals under test provided by a connector having at least 8 signal lines, comprising:

compensating for FEXT by use of hardware elements;

compensating for NEXT by use of software techniques, wherein said compensating for FEXT by use of hardware elements comprises:

providing a first capacitance connected between a first and third of said signal lines;

providing a second capacitance connected between a sixth and eighth of said signal lines;

providing a third capacitance connected between said third and a fifth of said signal lines;

providing a fourth capacitance connected between a fourth and said sixth signal line;

providing a first inductance in series between an input and output of said third said signal line;

providing a second inductance in series between an input and output of said fifth said signal line;

providing a third inductance in series between an input and output of said fourth said signal line; and providing a fourth inductance in series between an input and output of said sixth said signal line.

2. The method according to claim 1, wherein at least one of said first, second, third or fourth inductances comprises 1 nh.

3. The method according to claim 1, wherein at least one of said first, second, third or fourth capacitances comprises 0.5 pf.

4. The method according to claim 1, wherein said compensating for FEXT by use of hardware elements comprises providing a mutual inductance between said pair of said signal lines.

5. The method according to claim 1, wherein said inductances comprise inductances formed as traces on a printed circuit board.

* * * * *